United States Patent
Hazel et al.

(10) Patent No.: US 11,053,855 B2
(45) Date of Patent: Jul. 6, 2021

(54) REFLECTIVE COATING AND COATING PROCESS THEREFOR

(71) Applicant: United Technologies Corporation, Farmington, CT (US)

(72) Inventors: Brian T. Hazel, Avon, CT (US); Alan C. Barron, Jupiter, FL (US); Mary Catherine Gurak, Glastonbury, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 16/433,896

(22) Filed: Jun. 6, 2019

(65) Prior Publication Data
US 2020/0386165 A1    Dec. 10, 2020

(51) Int. Cl.
| C23C 14/08 | (2006.01) |
| C23C 14/30 | (2006.01) |
| C23C 16/06 | (2006.01) |
| C23C 16/455 | (2006.01) |
| F02C 7/24 | (2006.01) |

(52) U.S. Cl.
CPC ............. *F02C 7/24* (2013.01); *C23C 14/083* (2013.01); *C23C 14/30* (2013.01); *C23C 16/06* (2013.01); *C23C 16/45525* (2013.01); *F05D 2220/32* (2013.01); *F05D 2230/31* (2013.01); *F05D 2300/1431* (2013.01); *F05D 2300/1432* (2013.01); *F05D 2300/1433* (2013.01); *F05D 2300/1434* (2013.01); *F05D 2300/1435* (2013.01)

(58) Field of Classification Search
CPC . C23C 16/45525; C23C 14/083; C23C 14/30; C23C 16/06
See application file for complete search history.

(56) References Cited

U.S. PATENT DOCUMENTS

| 6,652,987 | B2 | 11/2003 | Allen et al. | |
| 7,285,312 | B2 | 10/2007 | Li | |
| 7,326,469 | B2 | 2/2008 | Dye et al. | |
| 2005/0158590 | A1* | 7/2005 | Li | C23C 16/403 |
| | | | | 428/698 |
| 2009/0304920 | A1* | 12/2009 | Elam | B01J 35/065 |
| | | | | 427/212 |
| 2013/0196141 | A1* | 8/2013 | Vassen | C23C 16/045 |
| | | | | 428/312.6 |

FOREIGN PATENT DOCUMENTS

| EP | 1428902 A1 | 6/2004 |
| EP | 1538238 A2 | 6/2005 |
| EP | 1538239 A2 | 6/2005 |
| EP | 2233600 A1 | 9/2010 |

OTHER PUBLICATIONS

EP Search Report dated Oct. 30, 2020 issued for corresponding European Patent Application No. 20178606.8.

* cited by examiner

*Primary Examiner* — Elizabeth A Burkhart
(74) *Attorney, Agent, or Firm* — Bachman & LaPointe, P.C.

(57) ABSTRACT

A process for coating a component includes applying a bond coat on a substrate of a component; applying a thermal barrier material to the bond coat; and applying a conforming reflective layer to the thermal barrier material, the conforming reflective layer conforming to porous microstructure of the ceramic coating.

9 Claims, 3 Drawing Sheets

REFLECTIVE COATING AND COATING PROCESS THEREFOR

BACKGROUND

The present disclosure relates to a method for forming an article having a protective ceramic coating which reduces radiation heat transport through the ceramic coating.

Gas turbine engines typically include a compressor to pressurize airflow, a combustor to burn a hydrocarbon fuel in the presence of the pressurized air, and a turbine to extract energy from the resultant combustion gases. The combustor and the turbine form a hot section of the engine and components therein often include a thermal barrier coating (TBC).

The thermal insulation provided by the TBC enables hot section components to survive higher operating temperatures, increases component durability, and improves engine durability. Thermal barrier coatings also maximize the effectiveness and efficiency of compressor exit air used to cool turbine components. Although surface temperatures of a turbine component may be higher than 2000 F (1093 C), the surface temperature of the overlying ceramic thermal barrier coating will be as much as 300 F (1648 C) hotter or more.

A typical state-of-the-art zirconium oxide-based thermal barrier coating applied by electron beam physical vapor deposition to a nickel-based alloy substrate typically includes a metallic bond layer applied to the surface of the substrate prior to deposition of the coating. With electron beam physical vapor deposition processing, the oxide ceramic of the coating usually acquires a columnar morphology during growth. Yttrium, magnesium, calcium and/or other suitable oxide is typically added to the zirconium oxide to stabilize the tetragonal and/or cubic crystal structure required for coating durability.

At higher-temperature, heat transport through typical ceramic thermal barrier coatings occur via conduction and radiation. Whereas the conduction of heat through these materials via phonon transport remains quite low over a wide range of temperature, the translucent nature of ceramic materials can allow for significant levels of heat transfer via radiation as the temperature increases. The heat transfer problems associated with thermal radiation are exacerbated in modern aircraft engines because of their high combustor pressures, which maximize the production of efficiently radiating carbon particulates, and their high peak combustion temperatures. Thermal radiation can contribute as much or even more to overall heat transfer than convective processes in these engines, particularly as temperatures increase.

SUMMARY

A process for coating a component according to one disclosed non-limiting embodiment of the present disclosure includes applying a thermal barrier material; and applying a conforming reflective layer to the thermal barrier material, the conforming reflective layer conforming to porous features of the ceramic coating.

A further aspect of the present disclosure includes penetrating the conforming reflective layer to a depth 20 times deeper than a gap opening of the porous microstructure of the ceramic coating.

A further aspect of the present disclosure includes penetrating the conforming reflective layer to a depth from one-quarter to three-quarters the way down the porous microstructure toward the substrate.

A further aspect of the present disclosure includes penetrating the conforming reflective layer into the porous features of the ceramic coating but not into physical contact with the substrate.

A further aspect of the present disclosure includes applying the platinum group metals via atomic layer deposition.

A further aspect of the present disclosure includes that the platinum group metal is formed from a precious metal selected from the group consisting of platinum, platinum alloys, palladium, palladium alloys, rhodium, rhodium alloys, iridium, iridium alloys, osmium, osmium alloys, ruthenium, ruthenium alloys and mixtures thereof.

A further aspect of the present disclosure includes applying the thermal barrier material via electron beam physical vapor deposition.

A further aspect of the present disclosure includes conforming the conforming reflective layer to an open porosity and gaps of the porous microstructure of the ceramic coating.

A process for coating a component according to one disclosed non-limiting embodiment of the present disclosure includes applying a bond coat on a substrate of a component; applying a thermal barrier material to the bond coat via electron beam physical vapor deposition; and applying a conforming reflective layer to the thermal barrier material via atomic layer deposition, the conforming reflective layer conforming to a porous microstructure of the ceramic coating.

A further aspect of the present disclosure includes penetrating the conforming reflective layer to a depth from one-quarter to three-quarters the way down the porous microstructure.

A further aspect of the present disclosure includes penetrating the conforming reflective layer to a depth 20 times deeper than a gap opening of the porous microstructure.

A gas turbine engine component according to one disclosed non-limiting embodiment of the present disclosure includes a thermal barrier material on the substrate; and a conforming reflective layer conforming to a porous microstructure of the ceramic coating.

A further aspect of the present disclosure includes that the conforming reflective layer penetrates to a depth 20 times a depth of a gap opening of the porous microstructure.

A further aspect of the present disclosure includes that the conforming reflective layer penetrates to a depth from one-quarter to three-quarters the way down the porous microstructure toward the substrate.

A further aspect of the present disclosure includes that the conforming reflective layer is formed from a precious metal selected from the group consisting of platinum, platinum alloys, palladium, palladium alloys, rhodium, rhodium alloys, iridium, iridium alloys, osmium, osmium alloys, ruthenium, ruthenium alloys and mixtures thereof.

A further aspect of the present disclosure includes a bond coat on the substrate, the thermal barrier material on the bond coat.

A further aspect of the present disclosure includes that the conforming reflective layer penetrates to a depth of 100 microns or greater into the porous microstructure but does not physically make contact with the substrate.

A further aspect of the present disclosure includes that the conforming reflective layer penetrates to a depth from one-quarter to three-quarters the way down the porous microstructure to the substrate.

A further aspect of the present disclosure includes that the conforming reflective layer penetrates to a depth 20 times a depth of a gap opening of the porous microstructure.

A further aspect of the present disclosure includes that the conforming reflective layer is at least 80 nm thick.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
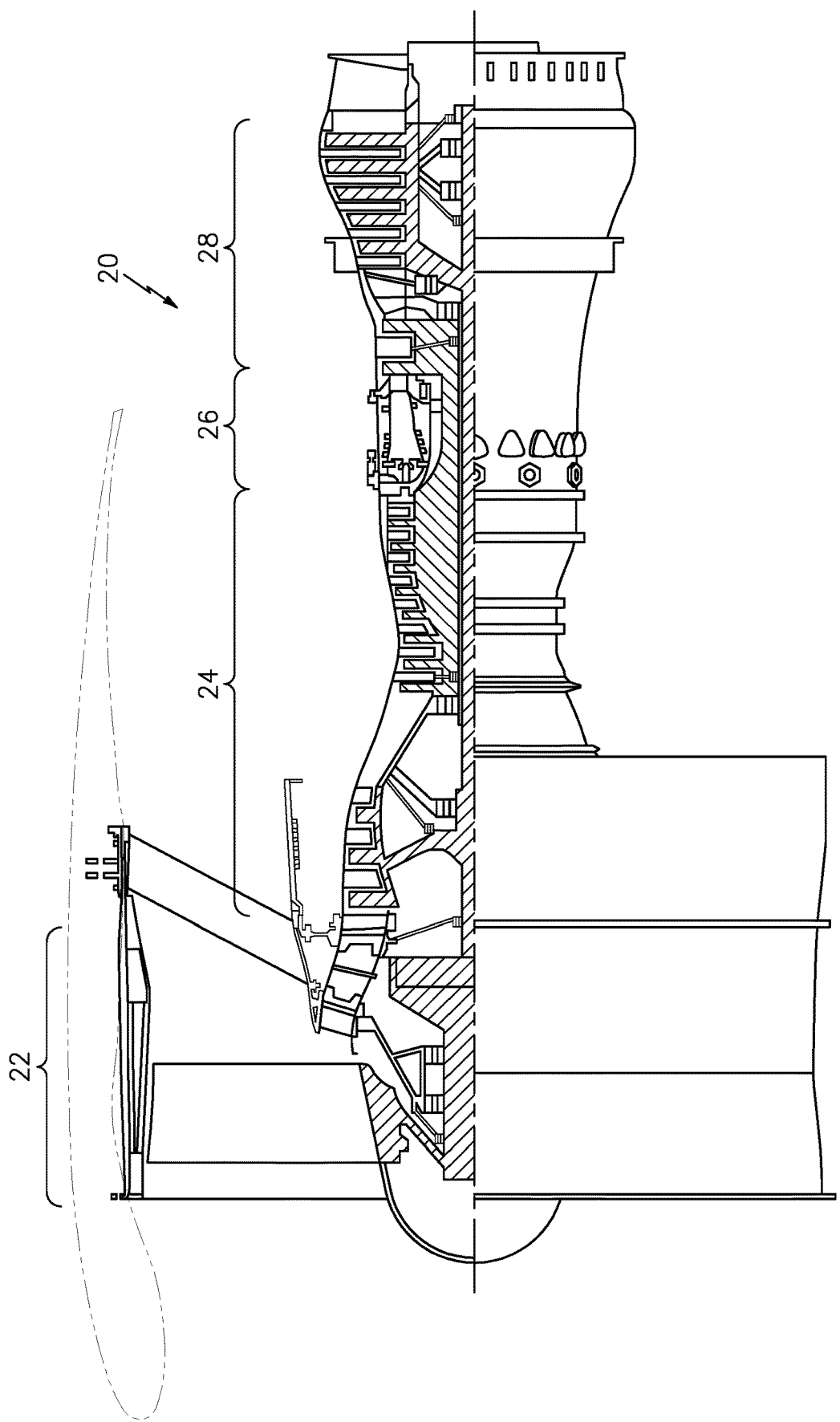
FIG. 1 is a schematic cross-section of an example gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbomachinery to include, but not be limited to, low bypass augmented turbofans, turbojets, turboshafts, three-spool (plus fan) turbofans and industrial gas turbines.

Figure 2:
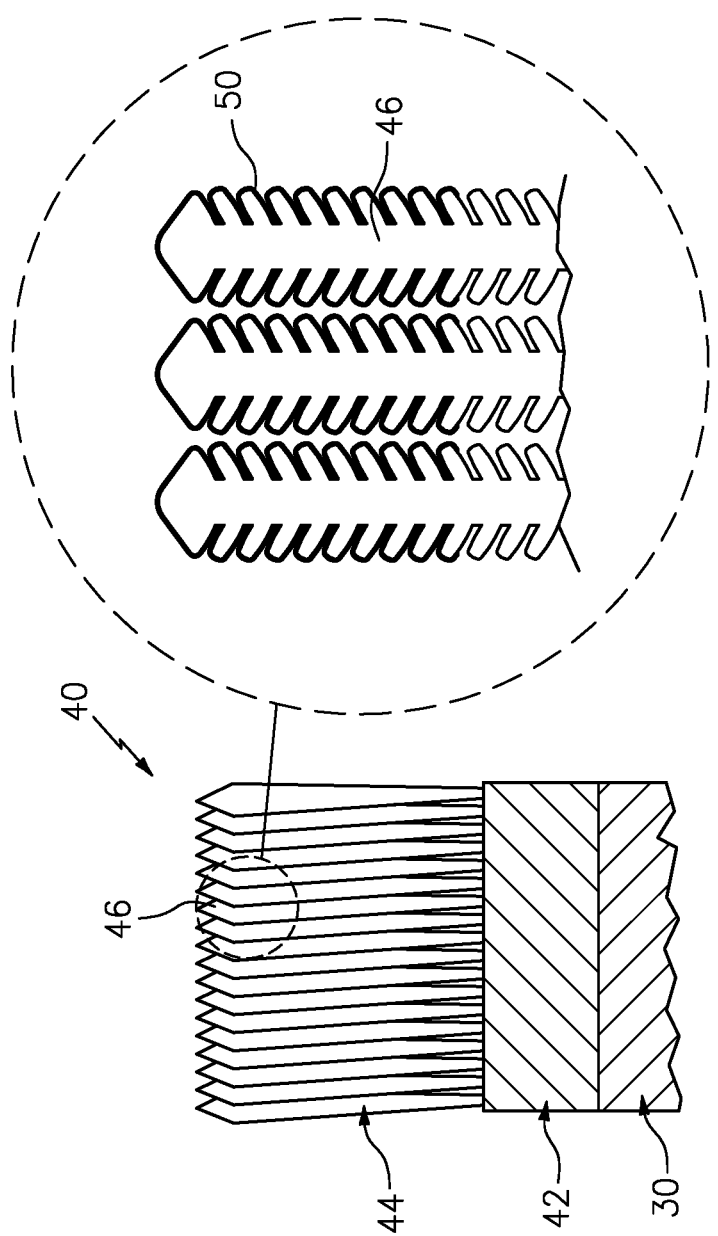
FIG. 2 is a cross-section through a coating system according to one disclosed non-limiting embodiment.

FIG. 2 illustrates a substrate 30, for example a turbine component such as a turbine blade, a combustor, a nozzle and/or a liner, or an aircraft exhaust duct to which a coating system 40 is applied. The coating system 40 as described herein is suitable for protection of the substrate 30 such as a superalloy but while being described with reference to such superalloy gas turbine engine components, the teachings herein are generally applicable to any component on which a TBC may be used to protect the component from a high temperature environment. Representative component examples of the substrate 30 include but are not limited to combustor section and/or turbine section hardware such as augmentor components, combustor liners, blades, vanes, and blade outer air seals.

The substrate 30 may be formed from any metallic or non-metallic material known in the art. In the context of turbine applications, the substrate 30 may be formed from a nickel-based alloy, an iron-based alloy, or a cobalt-based alloy. The substrate 30 could also be formed from a ceramic material such as a zirconia based ceramic, an alumina based ceramic, a magnesia based ceramic, a ceramic composite or a refractory material.

A metallic bond coat 42 is typically formed on the substrate 30 prior to the application of a protective ceramic coating 44. The bond coat 34 may be any suitable bond coat, such as a platinum-aluminide or diffusion aluminide coating or a MCrAlY type coating. The bond coat 34 may be applied in any manner known in the art. For example, a platinum-aluminum coating may be formed by electrodepositing a layer of platinum, vapor depositing an aluminum layer over the platinum, and thereafter interdiffusing the two layers. A MCrAlY coating may be applied using low-pressure plasma spray, air plasma spray, high velocity oxygen flame deposition, or electron beam physical vapor deposition.

The protective ceramic coating 44 may be a thermal barrier coating such as a yttria-, magnesium-, gadolinia- or calcium-stabilized zirconia coating. The ceramic coating 44 may be formed in any suitable manner, such as by plasma spray techniques or (electron beam physical) vapor deposition, to have any desired thickness, such as a thickness in the range of from about 0.002-0.040 inches. The ceramic coating 44 has a controlled microstructure which controls for porosity content and provides an interconnected porosity. Atmospheric thermal spray method, often referred to as air plasma spray (APS), is composed of fine individual splats of the ceramic material with approximately 10% or greater porosity. The porosity may have an interconnected nature. A version of the APS process has less than 10% total porosity but forms vertical crack features that are perpendicular to the metal/ceramic interface and are commonly referred to as dense vertically cracked or segmented (DVC) structures. A thermal sprayed method may also utilize a suspension powder source, suspension plasma spray (SPS), or a solution precursor source, solution precursor plasma spray (SPPS, which can form vertically cracked or columnar structures with features perpendicular to the metal/ceramic interface. Physical vapor deposition (PVD) deposits the ceramic material by means of condensation from the vapor which forms vertical single crystal columns. Electron beams are one heating source used to evaporate the ceramic material for the PVD process (EB-PVD). The protective ceramic coating 44 represents an EB-PVD processed ceramic coating with a controlled microstructure that includes essentially porous microstructure 46 that are feather shaped columns under high magnification.

Unlike metallic materials which are opaque, the translucent nature of ceramics allows for direct heat transfer via radiation over certain wavelengths. The amount of heat transferred through the ceramic via radiation during service at high temperature depends upon the predominant wavelengths of the incident radiation, the optical properties, such as emissivity and absorption coefficient, of the coating material, and the coating thickness. The optical transmittance of a thermal barrier coating comprised of yttria-stabilized zirconia is such that up to 80% of incident radiation in the 1-3 mu wavelength range is transmitted through a 0.002" coating.

The fraction of heat transfer that is radiative versus convective increases as the operating condition temperature increases. Recent modeling may indicate that a metallic turbine blade or vane has a 5% heat transfer via radiation versus convection. An advanced material blade/vane that has a 600 F (316 C) higher surface temperature would have up to 20% radiative heat transfer. It is further assumed that hardware in the combustor with higher gas path temperatures and line of site to the combustion flame may have an even higher radiative heat transfer component. Therefore, protection schemes that address radiation heat transfer can have an increasingly significant impact on part surface temperature.

As previously mentioned, ceramic coatings allow for direct heat transfer via radiation over certain wavelengths. This is due to the translucent nature of the oxide ceramics of the coatings. To reduce such radiation heat transport, conforming reflective layer 50 of a reflective material is applied onto the ceramic coating 44. Each reflective material conforming reflective layer 50 may be formed from an oxidation resistant material having a melting point higher than the use temperature of the ceramic coating 44. Each conforming reflective layer 50 is applied as a thin conforming layer that enters into the interconnected porosity of the ceramic coating 44. That is, the conforming reflective layer 50 is applied into the depths of the porosity of the ceramic coating 44

In one example, the conforming reflective layer 50 penetrates to a depth of 100 microns or greater into the porous microstructure 46 of the ceramic coating 44 but does not physically make contact with the substrate 30 that is to be insulated. In other words, the conforming reflective layer 50 penetrates to a depth from one-quarter to three-quarters the way down the porous microstructure 46 to the substrate 30. In another embodiment, the conforming reflective layer 50 penetrates to a depth 20 times a depth of a gap opening the porous microstructure. In another embodiment, the conforming reflective layer 50 minimum thickness relative to optical opacity for a PGM layer could be as small as 80 nm. This thickness has been demonstrated to be optically opaque on an optically polished/flat coupon. Being a metal, this translates to being fully reflective.

Platinum materials are opaque once they reach approximately 1000-2000 angstroms and therefore should not require microns or mils of thickness to be effective reflectors. Such a conformal layer thickness that essentially only coats the porous microstructure 46 will not affect the other functionality of the thermal barrier coating. That is, by using a non-line-of-sight deposition method such as, atomic layer deposition (ALD) coating method, the conforming reflective layer 50 conforms to open porosity and gaps of the thermal barrier coating. The ALD process has proven to obtain thickness upon the high aspect ratio features such as down the feather columns formed by the EB-PVD coating. This is in contrast to prior approaches that incorporated layers that fill the porous microstructure and form a near planar discrete layer. Other deposition methods such as or sol based methods with precursor chemicals may alternatively be utilized.

In one embodiment, each conforming reflective layer 50 is formed from a precious metal selected from the group consisting of platinum, platinum alloys, palladium, palladium alloys, rhodium, rhodium alloys, iridium, iridium alloys, osmium, ruthenium and mixtures thereof. Precious metals are well suited to this application because they are resistant to oxidation in a turbine environment. As a result, they will therefore retain the desired reflective properties during service. Further, they possess a melting point in excess of the ceramic coating operating conditions.

Figure 3:
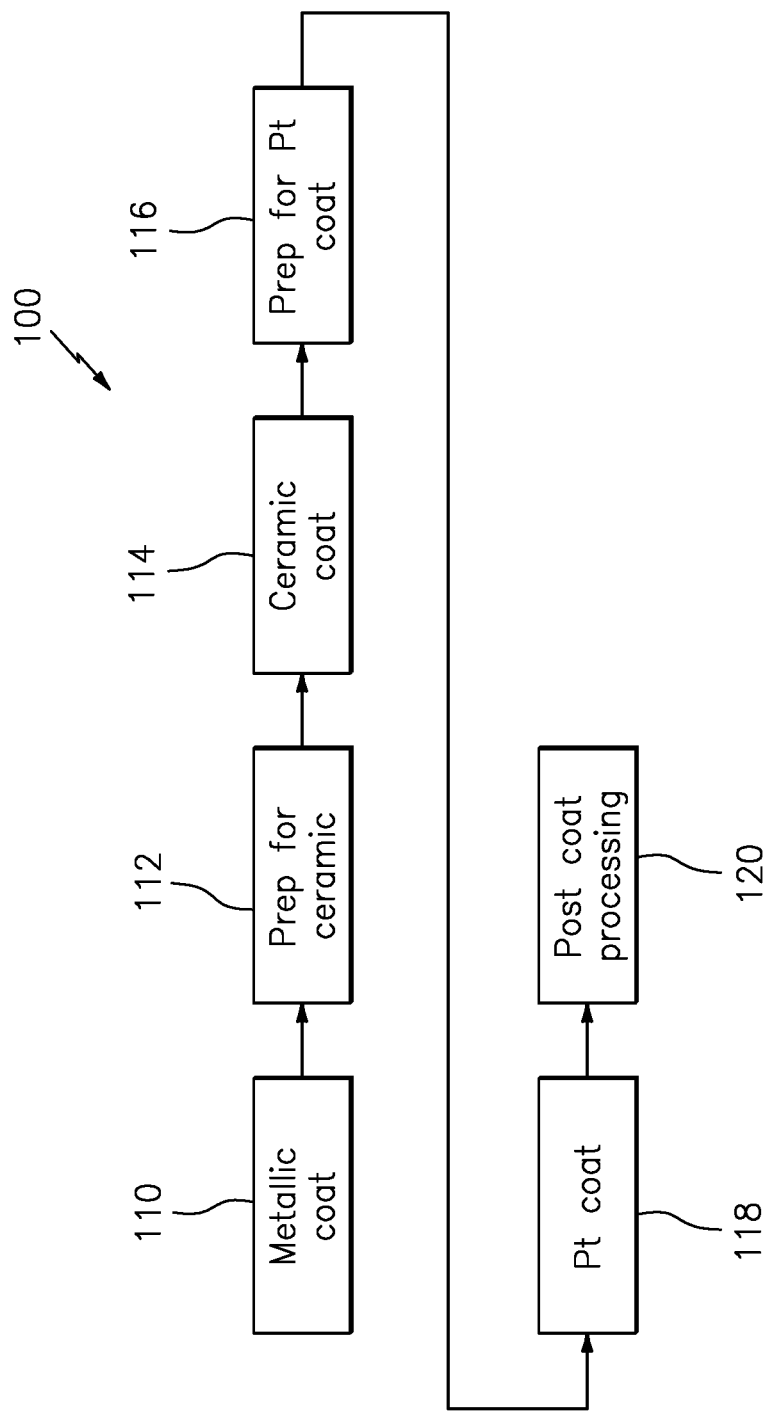
FIG. 3 is a flowchart of a process according to one disclosed non-limiting embodiment for application of a coating system to a component.

With reference to FIG. 3, a process 100 to form the coating system 40 onto the substrate 30 according to one disclosed non-limiting embodiment is disclosed in terms of functional block diagrams. The steps of the process 100 are schematically disclosed in terms of functional block diagrams as a flowchart. It should be appreciated that alternative or addition steps may be provided without departing from the teaching herein.

Initially, an optional metallic bond coat 42 is applied (step 110). The metallic bond coat 42 provides for environmental protection against oxidation corrosion and forms a bonding layer to the ceramic. Typically, an MCrAlY metallic bond coat 42 is applied via a low pressure plasma spray or other PVD method. The metallic bond coat 42 may be from about 50 to several hundred microns of thickness.

Once that the metallic bond coat 42 is applied, the surface is prepared for the ceramic (step 112). In one example, the preparation may include baking the component via an air furnace at temperatures of about 1000 F to burn off organics and other impurities such as machine oils, etc. The surface may also be prepared by mechanical processes such as grit blast to provide a controlled surface finish.

Next, the ceramic coating 44 is applied (step 114) thereto via, for example, electron beam physical vapor deposition, that grows the porous microstructure. The ceramic coating 44 may also be applied by atmospheric thermal spray as a porous layer or a layer with vertically segmented cracks/gaps, or by suspension or solution precursor thermal spray with vertical porous microstructure to form the porous microstructure. In one example the ceramic coating 44 may be of a thickness from 100 microns to several hundreds of microns depending on the application. Two current ceramics include yttria stabilized zirconia or gadolinium zirconate, but other ceramics are also possible.

Once the ceramic coating 44 is applied, the surface is again optionally prepared (step 116) for the conforming reflective layer 50. In one example, the preparation may again include thermal exposure to burn off deleterious organics, but not mechanical treatment so as to avoid anything which may damage the surface of the ceramic coating 44.

Next, the conforming reflective layer 50 is applied via, for example atomic layer deposition (step 118). It may be desirable to place the conforming reflective layer 50 as close as possible to the hot side of the coated article, i.e. the exposed surface of the coating, to achieve the maximum benefit in terms of cooling the substrate.

Finally, optional post coat processing (step 120) is performed such as cleanup operations, masking removal, burnishing, polishing, pencil grit blasting, etc.

The conforming reflective layer provides a conforming layer so it's not just at the surface, not just an overcoat, but a thin conforming layer to the microstructure. The conforming reflective layer requires only a minimal amount of material that forms a reflective surface. The conforming nature does not impact the strain tolerance and the functionality of the inherent ceramic coating 44 as the columns of the ceramic coating 44 are not tied together.

The use of the terms "a" and "an" and "the" and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to the normal operational attitude of the vehicle and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed:

1. A process for coating a component of a gas turbine engine, comprising:
    applying a thermal barrier material to form a ceramic coating with a porous microstructure on a substrate, the ceramic coating of a thickness from 100 microns to 200 microns; and
    applying a platinum group metal as an optically opaque oxidation resistant conforming reflective layer onto the thermal barrier material to enter into an interconnected porosity of the ceramic coating, the optically opaque oxidation resistant conforming reflective layer having a melting point higher than a use temperature of the ceramic coating to reduce radiation heat transport of the ceramic coating, the conforming reflective layer conforming to the porous microstructure of the ceramic coating to a depth from one-quarter to three-quarters the way down the porous microstructure, but not into physical contact with the substrate, wherein the platinum group metal is formed from a precious metal selected from the group consisting of platinum, platinum alloys and mixtures thereof.

2. The process as recited in claim 1, further comprising penetrating the conforming reflective layer to a depth 20 times deeper than a gap opening of the porous microstructure of the ceramic coating.

3. The process as recited in claim 1, further comprising applying the thermal barrier material via electron beam physical vapor deposition.

4. The process as recited in claim 1, further comprising conforming the conforming reflective layer to an open porosity and gaps of the porous microstructure of the ceramic coating.

5. The process as recited in claim 1, wherein the conforming reflective layer minimum thickness is 80 nm.

6. The process as recited in claim 1, wherein the conforming reflective layer is 1000-2000 angstroms thick.

7. A process for coating a turbine component of a gas turbine engine, comprising:
    applying a bond coat on a substrate of a component via electron beam physical vapor deposition;
    applying a thermal barrier material to the bond coat via electron beam physical vapor deposition to form a ceramic coating with a porous microstructure, the ceramic coating of a thickness from 100 microns to 200 microns (100,000-200,000 nm); and
    applying a precious metal as an optically opaque oxidation resistant conforming reflective layer onto the thermal barrier material via atomic layer deposition to a thickness of 1000-2000 angstroms (100-200 nm) such that the optically opaque oxidation resistant conforming reflective layer enters into an interconnected porosity of the ceramic coating, the optically opaque oxidation resistant conforming reflective layer having a melting point higher than a use temperature of the ceramic coating to reduce radiation heat transport of the ceramic coating, the conforming reflective layer conforming to the porous microstructure of the ceramic coating to a depth 20 times deeper than a gap opening of the porous microstructure, but not into physical contact with the substrate, wherein the precious metal is selected from the group consisting of platinum, platinum alloys, palladium, palladium alloys, rhodium, rhodium alloys, iridium, iridium alloys, osmium, ruthenium and mixtures thereof.

8. The process as recited in claim 7, further comprising penetrating the conforming reflective layer to a depth from one-quarter to three-quarters the way down the porous microstructure.

9. The process as recited in claim 7, wherein the platinum group metal is formed from a precious metal selected from the group consisting of platinum, platinum alloys and mixtures thereof.

* * * * *